(12) United States Patent
Luan

(10) Patent No.: US 9,859,196 B2
(45) Date of Patent: *Jan. 2, 2018

(54) ELECTRONIC DEVICE WITH PERIPHERY CONTACT PADS SURROUNDING CENTRAL CONTACT PADS

(71) Applicant: STMicroelectronics (Shenzhen) R&D Co. Ltd., Shenzhen (CN)

(72) Inventor: Jing-En Luan, Shenzhen (CN)

(73) Assignee: STMICROELECTRONICS (SHENZHEN) R&D CO., LTD., Shenzhen (CN)

( * ) Notice: Subject to any disclaimer, the term of this patent is extended or adjusted under 35 U.S.C. 154(b) by 0 days.

This patent is subject to a terminal disclaimer.

(21) Appl. No.: 15/251,127

(22) Filed: Aug. 30, 2016

(65) Prior Publication Data

US 2016/0372406 A1  Dec. 22, 2016

Related U.S. Application Data

(63) Continuation of application No. 14/984,082, filed on Dec. 30, 2015, now Pat. No. 9,466,557, which is a
(Continued)

(30) Foreign Application Priority Data

Nov. 29, 2013 (CN) .......................... 2013 1 0629973
Nov. 29, 2013 (CN) ..................... 2013 2 0783051 U

(51) Int. Cl.
*H01L 23/495* (2006.01)
*H01L 23/00* (2006.01)
(Continued)

(52) U.S. Cl.
CPC ........ *H01L 23/49531* (2013.01); *H01L 21/56* (2013.01); *H01L 21/76885* (2013.01);
(Continued)

(58) Field of Classification Search
CPC .............. H01L 23/49531; H01L 21/56; H01L 21/76885; H01L 23/3114; H01L 23/3675;
(Continued)

(56) References Cited

U.S. PATENT DOCUMENTS 5,835,988 A  11/1998 Ishii
6,020,637 A  2/2000 Kamezos
(Continued)

FOREIGN PATENT DOCUMENTS

CN  1160934 A  10/1997
CN  1773698 A  5/2006
(Continued)

OTHER PUBLICATIONS

Actel, "Assembly and PCB Layout Guidelines for QFN Packages," Application Note AC322, May 2008, 15 pages.

*Primary Examiner* — Alonzo Chambliss
(74) *Attorney, Agent, or Firm* — Slater Matsil, LLP

(57) ABSTRACT

An electronic device may include leads, an IC having first and second bond pads, and an encapsulation material adjacent the leads and the IC so the leads extend to a bottom surface of the encapsulation material defining first contact pads. The electronic device may include bond wires between the first bond pads and corresponding ones of the leads, and conductors extending from corresponding ones of the second bond pads to the bottom surface of the encapsulation material defining second contact pads.

39 Claims, 4 Drawing Sheets

Related U.S. Application Data continuation of application No. 14/547,549, filed on Nov. 19, 2014, now Pat. No. 9,287,227.

(51) Int. Cl.

| | | |
|---|---|---|
| *H01L 23/48* | (2006.01) | |
| *H01L 23/433* | (2006.01) | |
| *H01L 23/367* | (2006.01) | |
| *H01L 23/498* | (2006.01) | |
| *H01L 21/768* | (2006.01) | |
| *H01L 23/482* | (2006.01) | |
| *H01L 23/28* | (2006.01) | |
| *H01L 23/31* | (2006.01) | |
| *H01L 21/56* | (2006.01) | |

(52) U.S. Cl.
CPC ...... *H01L 23/3114* (2013.01); *H01L 23/3675* (2013.01); *H01L 23/4334* (2013.01); *H01L 23/481* (2013.01); *H01L 23/482* (2013.01); *H01L 23/49503* (2013.01); *H01L 23/49513* (2013.01); *H01L 23/49541* (2013.01); *H01L 23/49548* (2013.01); *H01L 23/49555* (2013.01); *H01L 23/49568* (2013.01); *H01L 23/49575* (2013.01); *H01L 23/49805* (2013.01); *H01L 23/49827* (2013.01); *H01L 23/49838* (2013.01); *H01L 24/03* (2013.01); *H01L 24/05* (2013.01); *H01L 24/06* (2013.01); *H01L 24/09* (2013.01); *H01L 24/33* (2013.01); *H01L 24/49* (2013.01); *H01L 24/73* (2013.01); *H01L 24/85* (2013.01); *H01L 24/92* (2013.01); *H01L 21/561* (2013.01); *H01L 23/28* (2013.01); *H01L 23/3107* (2013.01); *H01L 24/16* (2013.01); *H01L 24/45* (2013.01); *H01L 24/48* (2013.01); *H01L 24/81* (2013.01); *H01L 24/83* (2013.01); *H01L 2224/03003* (2013.01); *H01L 2224/03334* (2013.01); *H01L 2224/0401* (2013.01); *H01L 2224/04042* (2013.01); *H01L 2224/04105* (2013.01); *H01L 2224/0603* (2013.01); *H01L 2224/06102* (2013.01); *H01L 2224/06131* (2013.01); *H01L 2224/06135* (2013.01); *H01L 2224/06136* (2013.01); *H01L 2224/06177* (2013.01); *H01L 2224/09151* (2013.01); *H01L 2224/12105* (2013.01); *H01L 2224/16238* (2013.01); *H01L 2224/32221* (2013.01); *H01L 2224/32245* (2013.01); *H01L 2224/45124* (2013.01); *H01L 2224/45147* (2013.01); *H01L 2224/48091* (2013.01); *H01L 2224/48106* (2013.01); *H01L 2224/48245* (2013.01); *H01L 2224/48247* (2013.01); *H01L 2224/49175* (2013.01); *H01L 2224/73207* (2013.01); *H01L 2224/73253* (2013.01); *H01L 2224/73265* (2013.01); *H01L 2224/81815* (2013.01); *H01L 2224/85* (2013.01); *H01L 2224/92127* (2013.01); *H01L 2224/92242* (2013.01); *H01L 2224/92247* (2013.01); *H01L 2924/00014* (2013.01); *H01L 2924/14* (2013.01); *H01L 2924/181* (2013.01)

(58) Field of Classification Search
CPC . H01L 23/4334; H01L 23/481; H01L 23/482; H01L 21/76855; H01L 24/03; H01L 24/06; H01L 24/09; H01L 24/33; H01L 24/49; H01L 24/85
See application file for complete search history.

(56) References Cited

U.S. PATENT DOCUMENTS

| | | | |
|---|---|---|---|
| 6,054,759 | A | 4/2000 | Nakamura |
| 7,355,289 | B2 * | 4/2008 | Hess .................. H01L 23/3677 257/787 |
| 7,548,430 | B1 | 6/2009 | Huemoeller et al. |
| 7,786,591 | B2 | 8/2010 | Khan et al. |
| 7,898,067 | B2 | 3/2011 | Jereza |
| 7,960,827 | B1 | 6/2011 | Miller, Jr. et al. |
| 8,008,132 | B2 | 8/2011 | Upadhyayula et al. |
| 8,193,555 | B2 | 6/2012 | Lin et al. |
| 8,304,277 | B2 | 11/2012 | Pagaila |
| 8,304,871 | B2 | 11/2012 | Yu et al. |
| 8,362,601 | B2 | 1/2013 | Camacho et al. |
| 8,383,962 | B2 | 2/2013 | Sutardja |
| 8,441,113 | B2 | 5/2013 | Lee |
| 8,456,856 | B2 | 6/2013 | Lin et al. |
| 8,470,644 | B2 | 6/2013 | Yu et al. |
| 9,287,227 | B2 * | 3/2016 | Luan ...................... H01L 24/85 |
| 9,466,557 | B2 * | 10/2016 | Luan ...................... H01L 24/85 |
| 2006/0065972 | A1 | 3/2006 | Khan et al. |
| 2007/0130759 | A1 | 6/2007 | Harnden et al. |
| 2009/0072365 | A1 | 3/2009 | Tay et al. |
| 2009/0166825 | A1 | 7/2009 | Camacho et al. |
| 2009/0166828 | A1 | 7/2009 | Upadhyayula et al. |
| 2009/0261461 | A1 | 10/2009 | Sapp et al. |
| 2010/0109134 | A1 | 5/2010 | Jereza |
| 2010/0127360 | A1 | 5/2010 | Pagaila et al. |
| 2010/0140764 | A1 | 6/2010 | Camacho et al. |
| 2010/0200898 | A1 | 8/2010 | Lin et al. |
| 2010/0246152 | A1 | 9/2010 | Lin et al. |
| 2011/0309485 | A1 | 12/2011 | Upadhyayula et al. |
| 2012/0061822 | A1 | 3/2012 | Pagaila |
| 2012/0153468 | A1 | 6/2012 | Lee |
| 2012/0181676 | A1 | 7/2012 | Tsui et al. |
| 2012/0181677 | A1 | 7/2012 | Tsui et al. |
| 2012/0228681 | A1 | 9/2012 | Lin et al. |
| 2012/0256306 | A1 | 10/2012 | Yu et al. |
| 2013/0009297 | A1 | 1/2013 | Tsui et al. |
| 2013/0015577 | A1 | 1/2013 | Pagaila |
| 2013/0017652 | A1 | 1/2013 | Tsui et al. |
| 2013/0034937 | A1 | 2/2013 | Yu et al. |
| 2013/0118008 | A1 | 5/2013 | Gaynes et al. |
| 2013/0242500 | A1 | 9/2013 | Lin et al. |

FOREIGN PATENT DOCUMENTS

| | | |
|---|---|---|
| CN | 101859744 A | 10/2010 |
| CN | 203871315 U | 10/2014 |
| TW | 436997 B | 5/2001 |

\* cited by examiner

ELECTRONIC DEVICE WITH PERIPHERY CONTACT PADS SURROUNDING CENTRAL CONTACT PADS

CROSS-REFERENCE TO RELATED APPLICATIONS

This application is a continuation of U.S. patent application Ser. No. 14/984,082, filed on Dec. 30, 2015 (now U.S. Pat. No. 9,466,557), which is a continuation of U.S. patent application Ser. No. 14/547,459, filed on Nov. 19, 2014 (now U.S. Pat. No. 9,287,227), which claims the priority of Chinese Patent Application No. 201310629973.7, filed on Nov. 29, 2013 and Chinese Patent Application No. 201320783051.7, filed on Nov. 29, 2013, each of which is incorporated herein by reference in its entirety.

TECHNICAL FIELD

The present disclosure relates to the field of electronic devices, and, more particularly, to integrated circuits and related methods.

BACKGROUND

In electronic devices with integrated circuits (ICs), the ICs are typically mounted onto circuit boards. In order to electrically couple connections between the circuit board and the IC, the IC is typically "packaged." The IC packaging usually provides a small encasement for physically protecting the IC and provides contact pads for coupling to the circuit board. In some applications, the packaged IC may be coupled to the circuit board via wire bonds or solder bumps.

One approach to IC packaging comprises a quad-flat no-leads (QFN) package. The OFM may provide some advantages, such as reduced lead inductance, a near chip scale footprint, thin profile, and low weight. Also, the QFN package typically includes perimeter I/O pads to ease circuit board trace routing, and the exposed copper die-pad technology offers enhanced thermal and electrical performance. QFN packaging may be well suited for applications where size, weight, and thermal and electrical performance are important.

Referring to FIG. 1, a typical QFN packaged electronic device 90 is now described. The electronic device 90 includes a plurality of leads 93a-93k, and a medially placed heat sink 91 adjacent thereto. The electronic device 90 includes an adhesive layer 96 on the heat sink 91, an IC 92 on the adhesive layer, and a plurality of wire bonds 97a-97k coupling the IC to the plurality of leads 93a-93k. The electronic device 90 also includes an encapsulation material 95 surrounding the IC 92, the plurality of wire bonds 97a-97k, and the plurality of leads 93a-93k. This electronic device 90 may have some drawbacks. In particular, the IC 92 includes a single row of band pads 81a-81k at a periphery thereof, thereby providing limited connections.

SUMMARY

An electronic device comprises a plurality of leads, and an IC comprising first and second pluralities of bond pads. The electronic device also includes an encapsulation material adjacent the plurality of leads and the IC so the plurality of leads extends to a bottom surface of the encapsulation material defining a first plurality of contact pads, a plurality of bond wires between the first plurality of bond pads and corresponding ones of the plurality of leads, and a plurality of conductors extending from corresponding ones of the second plurality of bond pads to the bottom surface of the encapsulation material defining a second plurality of contact pads. Advantageously, the electronic device may provide a QFN package with a mixed interconnect technique.

In particular, the first plurality of contact pads may be arranged around a periphery of the bottom surface of the encapsulation material. The second plurality of contact pads may be arranged on a medial portion of the bottom surface of the encapsulation material. The first plurality of bond pads may be arranged around a periphery of a top surface of the IC, and the second plurality of bond pads may be arranged on a medial portion of the top surface of the IC.

Also, the electronic device may further comprise a heat sink exposed on a top surface of the encapsulation material. The IC may be coupled to the heat sink. The first and second pluralities of bond pads may be on the top surface of the IC, and the IC may have a bottom surface coupled to the heat sink.

In some embodiments, each of the plurality of conductors may comprise an elongate conductor. In other embodiments, the plurality of conductors may comprise an interposer. The interposer may comprise a semiconductor substrate and a plurality of conductive vias extending therethrough. The plurality of conductors may further comprise a plurality of solder bodies between the second plurality of bond pads and the interposer. Each of the plurality of leads may have a sidewall exposed on a corresponding side of the encapsulation material.

Another aspect is directed to a method for making an electronic device. The method may comprise coupling a plurality of wire bonds between a first plurality of bond pads of an IC and corresponding ones of a plurality of leads, coupling a plurality of conductors to extend outwardly from a second plurality of bond pads of the IC, and forming an encapsulation material adjacent the plurality of leads and the IC so the plurality of leads extends to a bottom surface of the encapsulation material defining a first plurality of contact pads, and so that the plurality of conductors extends to the bottom surface defining a second plurality of contact pads.

DETAILED DESCRIPTION OF ILLUSTRATIVE EMBODIMENTS

The present embodiments will now be described more fully hereinafter with reference to the accompanying drawings, in which preferred embodiments of the present disclosure are shown. This present embodiments may, however, be embodied in many different forms and should not be construed as limited to the embodiments set forth herein. Rather, these embodiments are provided so that this disclosure will be thorough and complete, and will fully convey the scope of the present disclosure to those skilled in the art. Like numbers refer to like elements throughout, and prime and double prime notation are used to indicate similar elements in alternative embodiments.

Figure 1:
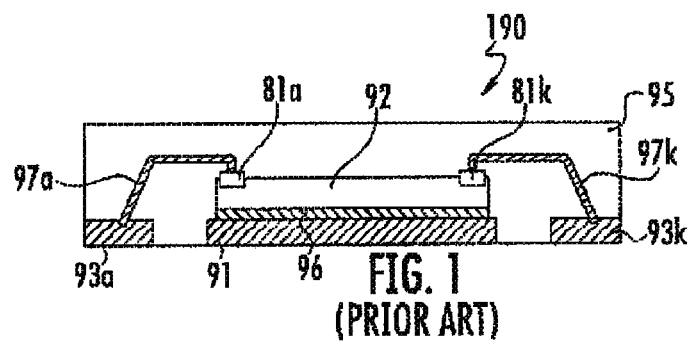
FIG. 1 is a schematic diagram of a cross sectional view of an electronic device, according to the prior art.
Figure 2:
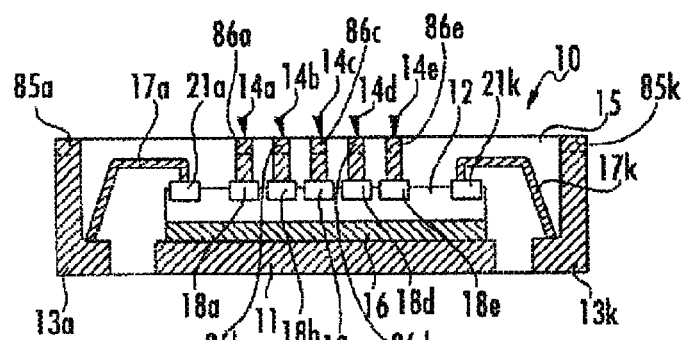
FIG. 2 is a schematic diagram of a cross sectional view of an electronic device, according to the present disclosure.
Figure 3A:
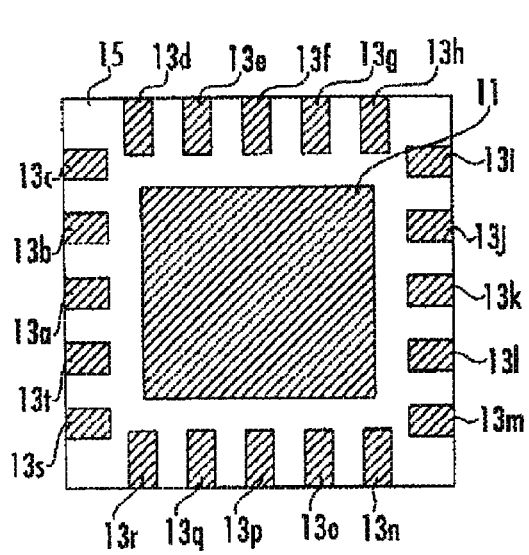
FIGS. 3A-3B are top and bottom plan views of the electronic device of FIG. 2.
Figure 3B:
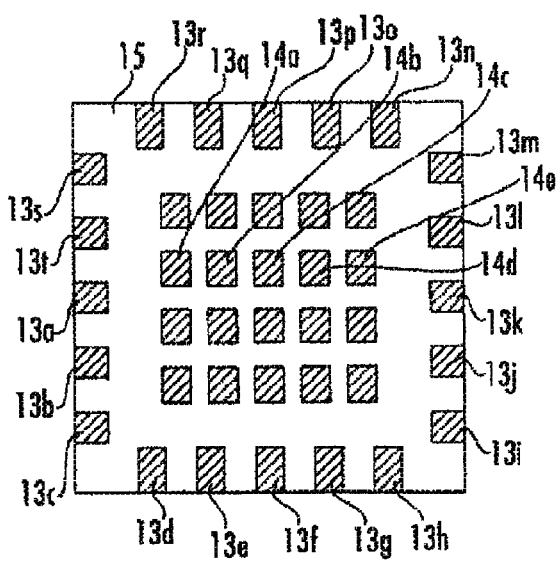

Referring to FIGS. 2-3B, an electronic device 10 according to the present disclosure is now described. The electronic device 10 illustratively includes a plurality of leads 13a-13t, and an IC 12 positioned within the plurality of leads. The plurality of leads 13a-13t comprises an electrically conductive material, for example, copper or aluminum. The IC 12 illustratively includes first 21a-21k and second 18a-18e pluralities of bond pads (e.g., copper, aluminum). The first plurality of bond pads 21a-21k is arranged around a periphery of a top surface of the IC 12, and the second plurality of bond pads 18a-18e is arranged on a medial portion of the top surface of the IC.

The electronic device 10 also includes an encapsulation material 15 adjacent the plurality of leads 13a-13t and the IC 12. In particular, the encapsulation material 15 fills in the area between the leads 13a-13t, thereby surrounding the IC 12. As perhaps best seen in FIG. 3B, the encapsulation material 15 is formed so the plurality of leads 13a-13t extends to a bottom surface of the encapsulation material defining a first plurality of contact pads 85a, 85k. The first plurality of contact pads 85a, 85k is arranged around a periphery of the bottom surface of the encapsulation material 15. Each of the plurality of leads 13a-13t illustratively has a sidewall exposed on a corresponding side of the encapsulation material 15. Also, as perhaps best seen in FIG. 3A, the plurality of leads 13a-13t also extends to a top surface of the encapsulation material 15, thereby providing access to the first plurality of contact pads 85a, 85k on either side of the electronic device 10.

The electronic device 10 includes a plurality of bond wires 17a-17k (e.g., copper, aluminum) between the first plurality of bond pads 21a-21k and corresponding ones of the plurality of leads 13a-13t, and a plurality of conductors 14a-14e extending from corresponding ones of the second plurality of bond pads 18a-18e to the bottom surface of the encapsulation material 15 defining a second plurality of contact pads 86a-86e (FIG. 2). In the illustrated embodiment, each of the plurality of conductors 14a-14e comprises an elongate conductor, for example, an electrically conductive via made from copper or aluminum. The second plurality of contact pads 86a-86e is arranged on a medial portion of the bottom surface of the encapsulation material 15 (i.e., being within the first plurality of contact pads).

Also, the electronic device 10 illustratively includes a heat sink 11 exposed on a top surface of the encapsulation material 15. In the illustrated embodiment, the electronic device 10 includes a layer of thermally conductive adhesive material 16 between the heat sink 11 and the IC 12 for coupling the two together. As noted above, the first 21a-21k and second 18a-18e pluralities of bond pads may be on the top surface of the IC 12 while the bottom surface of the IC is coupled to the heat sink 11.

Figure 4:
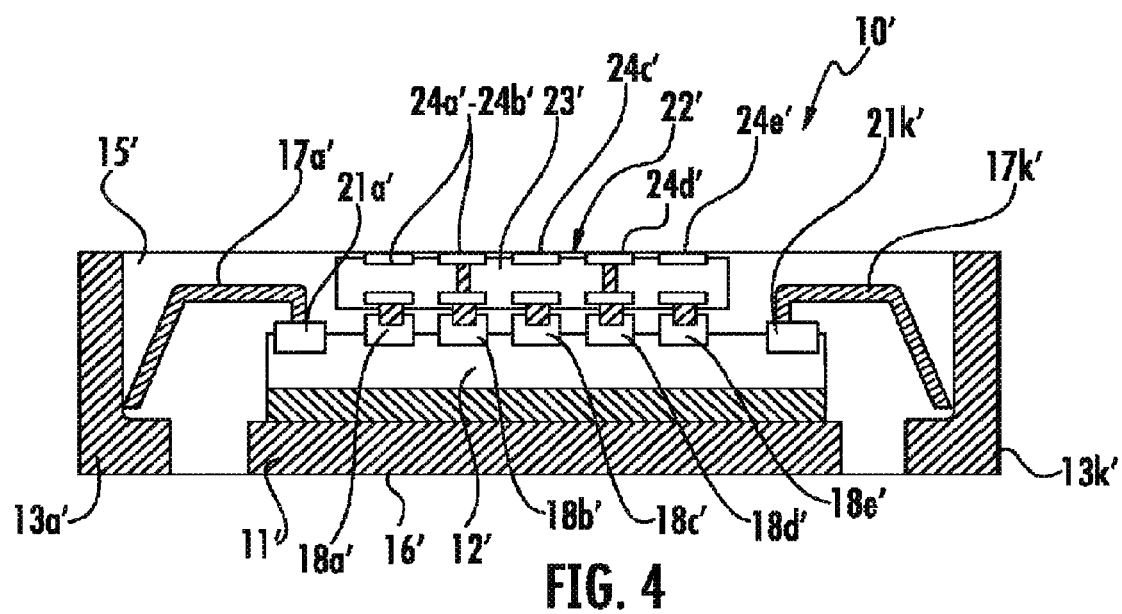
FIGS. 4-5 are schematic diagrams of cross sectional views of other embodiments of the electronic device, according to the present disclosure.

Referring now additionally to FIG. 4, another embodiment of the electronic device 10' is now described. In this embodiment of the electronic device 10', those elements already discussed above with respect to FIGS. 2-3B (13a', 11', 12', 15', 16', 17a', 12', 13k', 17k', 21a', 21k') are given prime notation and most require no further discussion herein. This embodiment differs from the previous embodiment in that this electronic device 10' has the plurality of conductors comprising an interposer 22'. The interposer 22' illustratively includes a semiconductor substrate 23', and a plurality of conductive vias 24a'-24e' (e.g., copper, aluminum) extending therethrough. The interposer 22' may be coupled to the second pluralities of bond pads 18a'-18e' using electrically conductive paste or reflow solder. Also, the semiconductor substrate 23' may comprise a silicon substrate, an organic substrate, or a ceramic substrate.

Figure 5:
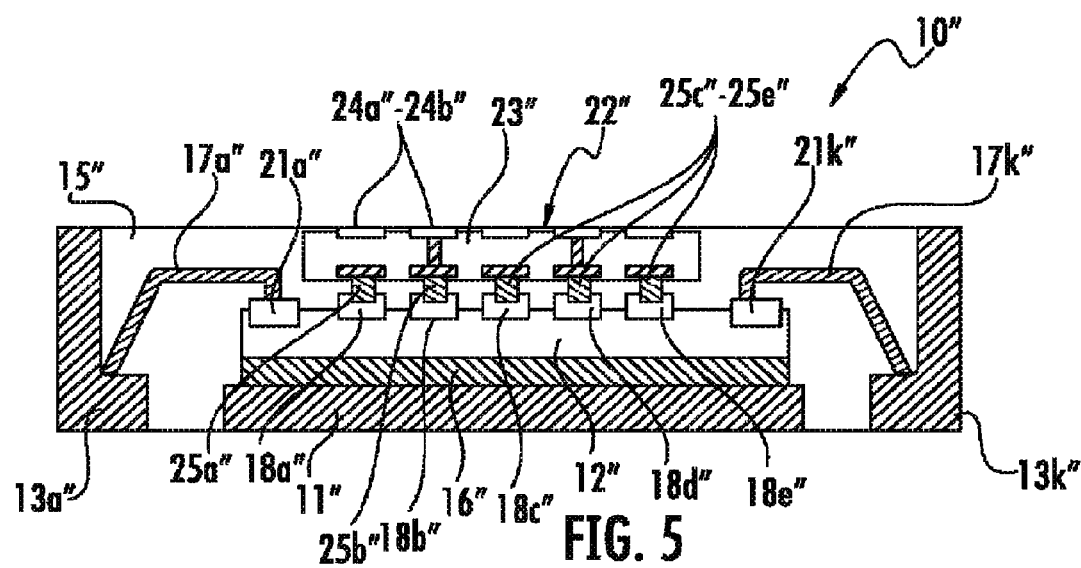
Figure 6A:
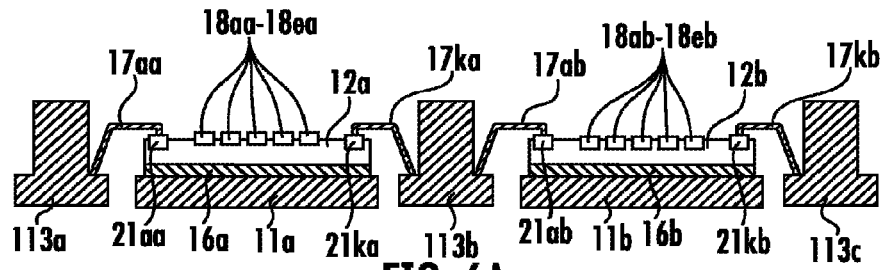
FIGS. 6A-6E are schematic diagrams of cross sectional views of steps in a method for making the electronic device of FIG. 2.
Figure 6B:
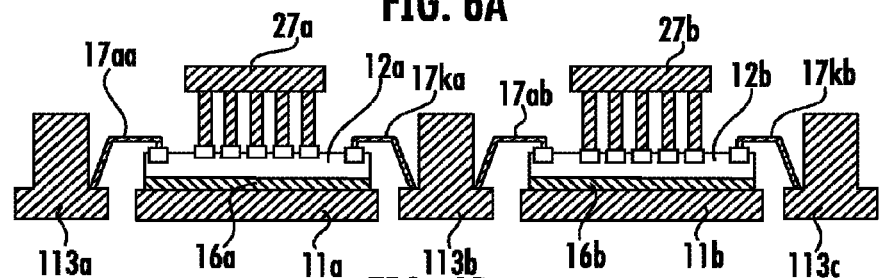
Figure 6C:
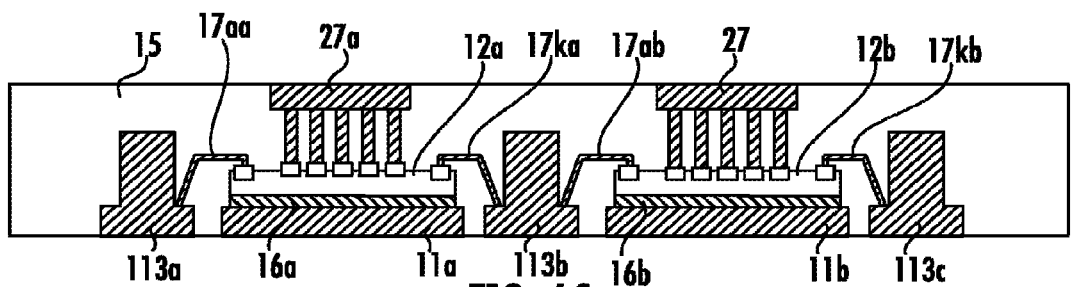
Figure 6D:
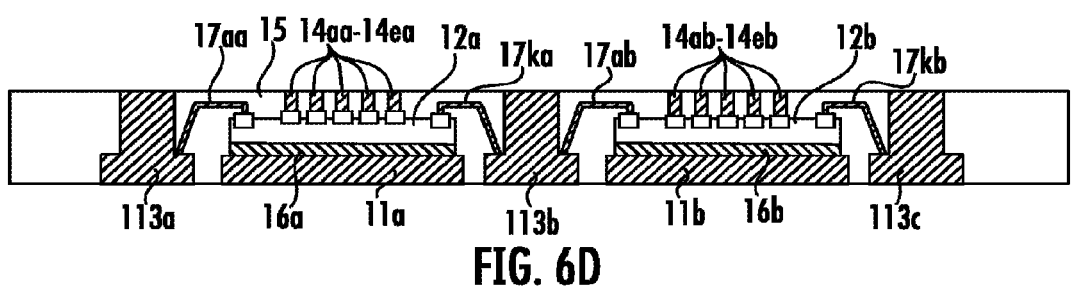
Figure 6E:
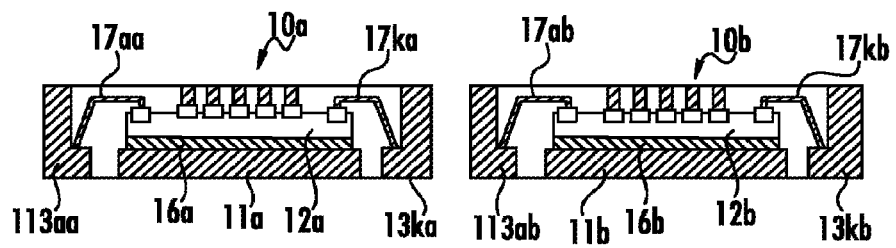
Figure 7A:
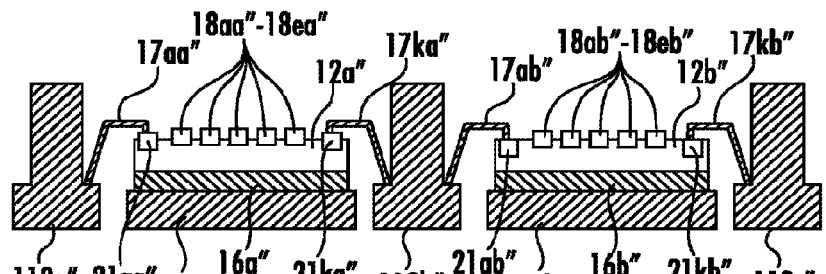
FIGS. 7A-7D are schematic diagrams of cross sectional views of steps in a method for making the electronic device of FIG. 5.
Figure 7B:
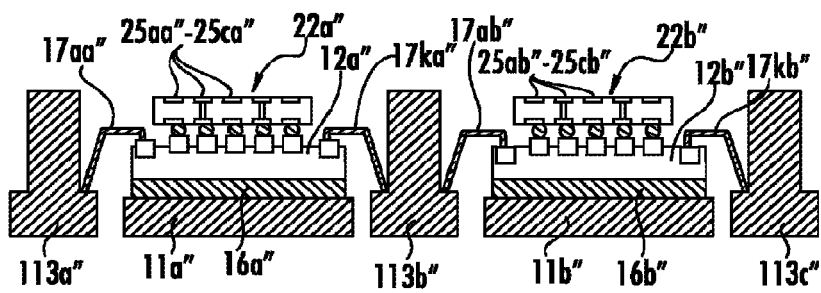
Figure 7C:
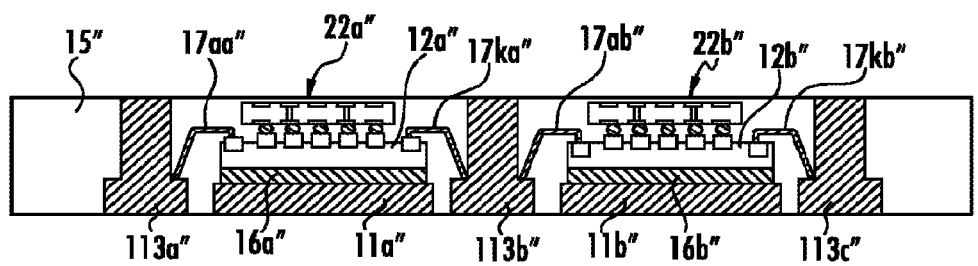
Figure 7D:
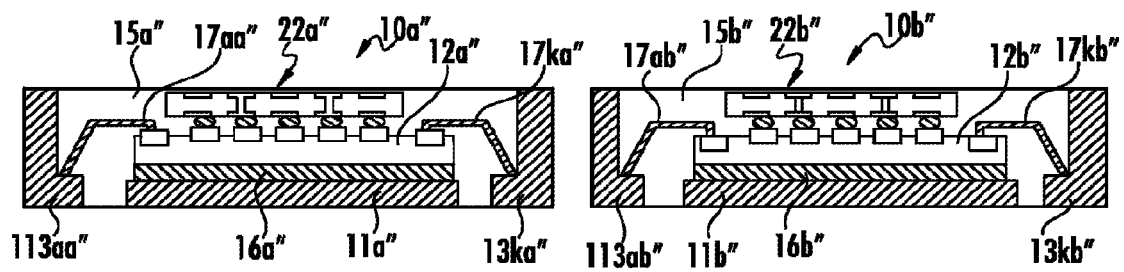

Referring now additionally to FIG. 5, another embodiment of the electronic device 10" is now described. In this embodiment of the electronic device 10", those elements already discussed above with respect to FIGS. 2-3B (15", 13a"-13k", 16", 21a", 11", 16", 12", 17a"-17k", 10", 21a"-21k", 24a"-24b", 22", 23", 17aa"-17kb", 12a"-12b", 113a", 21aa"-21kb", 11a"-11b", 16a"-16b", 25aa"-25cb", 22a"-22b", 13aa", 13ab", 13ka", 13kb", 15a", 18aa"-18eb") are given double prime notation and most require no further discussion herein. This embodiment differs from the previous embodiment in that this electronic device 10" has the plurality of conductors further comprising a plurality of solder bodies 25a"-25e" between the second plurality of bond pads 18a"-18e" and the interposer 22".

Another aspect is directed to a method for making an electronic device 10. The method may comprise coupling a plurality of wire bonds 17a-17k between a first plurality of bond pads 21a-21k of an IC 12 and corresponding ones of a plurality of leads 13a-13t, coupling a plurality of conductors 14a-14e to extend outwardly from a second plurality of bond pads 18a-18e of the IC, and forming an encapsulation material 15 adjacent the plurality of leads and the IC so the plurality of leads extends to a bottom surface of the encapsulation material defining a first plurality of contact pads 85a, 85k, and so that the plurality of conductors extends to the bottom surface defining a second plurality of contact pads 86a-86e.

Advantageously, the electronic device 10 may provide a QFN packaged device with a mixed interconnect technique, i.e., providing both wire bonds 17a-17k and electrically conductive vias 14a-14e for coupling to the IC 12. The electronic device 10 also provides multiple rows of contacts, which increase the die to package ratio. Moreover, the electronic device 10 is readily stackable and provides improved thermal performance over existing approaches.

Referring now additionally to FIGS. 6A-6E, a method for making the electronic device 10 of FIG. 2 is now described. In the illustrated embodiment, the method manufactures first and second electronic devices 10a, 10b (FIG. 6E), but it should be appreciated that via wafer level processing techniques, the method can be expanded for simultaneous manufacture of a large number of devices (i.e., much greater than the illustrated two). The method illustratively includes positioning stacks of the ICs 12a-12b, the heat sinks 11a-11b, and the adhesive material 16a-16b therebetween. The plurality of leads 113a-113c is positioned to surround the stacks. The method includes forming the pluralities of the wire bonds 17aa-17ka, 17ab-17kb between the ICs 12a-12b and the plurality of leads 113a-113c.

The method illustratively includes coupling a conductive frame 27a-27b (e.g., copper, aluminum) onto the respective stacks. In particular, the conductive frames 27a-27b each comprises a head portion, and a plurality of legs extending therefrom. The legs of the conductive frame 27a-27b are aligned with the second plurality of bond pads 18aa-18ea, 18ab-18eb for the first and second ICs 12a-12b. The method may include applying electrically conductive paste between the legs of the conductive frame 27a-27b and the second plurality of bond pads 18aa-18ea, 18ab-18eb. Helpfully, the head portion provides a readily graspable portion for aiding assembly, for example, using a pick-and-place machine.

The method illustratively includes forming the encapsulation material 15 to surround the stacks and the leads 113a-113c. The method illustratively includes grinding down a surface of the encapsulation material 15, which forms the lower surface of the electronic devices 10a-10b, so that the legs of the conductive frame 27a-27b remain (i.e., severing portions of the conductive frame 27a-27b to define the plurality of conductors 14aa-14ea, 14ab-14eb). The legs of the conductive frame 27a-27b define the plurality of conductors 14aa-14ea, 14ab-14eb in the electronic devices 10a-10b. The method illustratively includes a singulation step where, for example, a blade cuts the piece along a midpoint of the leads 113a-113c.

Referring now additionally to FIGS. 7A-7D, a method for making the electronic device 10" of FIG. 5 is now described. In the illustrated embodiment, the method manufactures first and second electronic devices 10a", 10b" (FIG. 7D), but it should be appreciated that via wafer level processing techniques, the method can be expanded for simultaneous manufacture of a large number of devices.

The method illustratively includes positioning the stacks of the ICs 12a"-12b", the heat sinks 11a"-11b", and the adhesive material 16a"-16b" therebetween. The plurality of leads 113a"-113c" is positioned to surround the stacks. The method includes forming the pluralities of the wire bonds 17aa"-17ka", 17ab"-17kb" between the ICs 12a"-12b" and the plurality of leads 113a"-113c". The method illustratively includes forming a plurality of solder bodies 25aa"-25ea", 25ab"-25eb" on the second plurality of bond pads 18aa"-18ea", 18ab"-18eb" of the ICs 12a"-12b". The method also includes positioning the interposers 22a"-22b" on the plurality of solder bodies 25aa"-25ea", 25ab"-25eb".

The method illustratively includes forming the encapsulation material 15" to surround the stacks, the leads 113a"-113c", and the interposers 22a"-22a". The method illustratively includes a singulation step where a blade cuts the piece along the midpoint of the leads 113a"-113c".

Many modifications and other embodiments of the present disclosure will come to the mind of one skilled in the art having the benefit of the teachings presented in the foregoing descriptions and the associated drawings. Therefore, it is understood that the present embodiments are not to be limited to the specific embodiments disclosed, and that modifications and embodiments are intended to be included within the scope of the appended claims.

What is claimed is:

1. A semiconductor device comprising:
an integrated circuit;
an encapsulating material overlying an upper surface of the integrated circuit;
a plurality external contacts disposed at an outer surface of the encapsulating material;
wherein each of the external contacts is electrically connected to the integrated circuit;
wherein ones of the external contacts are electrically connected to the integrated circuit via wire bonds; and
wherein other ones of the external contacts are electrically connected to the integrated circuit via conductive vias without any wire bonds.

2. The device of claim 1, further comprising a heat sink thermally coupled to a lower surface of the integrated circuit, the lower surface opposite the upper surface.

3. The device of claim 2, further comprising a thermally conductive adhesive material disposed between the lower surface of the integrated circuit and the heat sink.

4. The device of claim 1, wherein the integrated circuit has an upper surface that includes a central region and a peripheral region that surrounds the central region, wherein a plurality of central bond pads are disposed in the central region and a plurality of periphery bond pads are disposed in the peripheral region, wherein the ones of the external contacts comprise periphery contacts that are electrically connected to respective ones of the periphery bond pads, and wherein the other ones of the external contacts comprise central contacts that are electrically connected to respective ones of the central bond pads.

5. The device of claim 4, wherein each of the periphery contacts includes a sidewall exposed on a corresponding side of the encapsulating material.

6. The device of claim 4, wherein each of the periphery contacts extends from the outer surface of the encapsulating material to a lower surface of the encapsulating material.

7. The device of claim 6, further comprising a second integrated circuit that physically attached at the lower surface of the encapsulating material and is electrically coupled the integrated circuit through the periphery contacts.

8. The device of claim 1, wherein each of the other ones of the external contacts comprises a single conductive via that extends from a respective central bond pad to the outer surface of the encapsulating material.

9. The device of claim 1, wherein the other ones of the external contacts comprise an interposer disposed between the upper surface of the integrated circuit and the outer surface of the encapsulating material.

10. The device of claim 9, wherein the interposer comprises a semiconductor substrate and a plurality of conductive vias extending through the semiconductor substrate.

11. The device of claim 9, wherein the interposer is coupled to the integrated circuit using electrically conductive paste or reflow solder.

12. The device of claim 9, further comprising a plurality of solder bodies disposed between the integrated circuit and the interposer.

13. The device of claim 1, wherein the external contacts are arranged in a plurality of rows, each row including a plurality of the external contacts.

14. The device of claim 1, wherein the ones of the external contacts each comprise a conductive material that extends through the encapsulating material, the conductive material electrically connected to the integrated circuit through a respective wire bond.

15. The device of claim 1, wherein the other ones of the external contacts comprise an interposer.

16. A semiconductor device comprising:
an integrated circuit having an upper surface that includes a central region and a peripheral region that surrounds the central region, a plurality of central bond pads being disposed in the central region and a plurality of periphery bond pads being disposed in the peripheral region;
a plurality of periphery leads surrounding the integrated circuit and spaced therefrom;
a plurality of bond wires electrically connecting each of the periphery bond pads to a respective one of the periphery leads;
a plurality of central leads, each central lead being electrically connected to a respective one of the central bond pads; and
an encapsulating material formed over the upper surface of the integrated circuit and between the periphery leads and the integrated circuit, the periphery leads and the central leads extending to an outer surface of the encapsulating material so as to be accessible for electrical connection to the integrated circuit.

17. The device of claim 16, further comprising a heat sink thermally coupled to a lower surface of the integrated circuit, the lower surface opposite the upper surface.

18. The device of claim 17, further comprising a thermally conductive adhesive material disposed between the lower surface of the integrated circuit and the heat sink.

19. The device of claim 17, wherein the encapsulating material is in contact with the heat sink.

20. The device of claim 16, wherein each of the periphery leads includes a sidewall exposed on a corresponding side of the encapsulating material.

21. The device of claim 16, wherein each of the periphery leads extends from the outer surface of the encapsulating material to a lower surface of the encapsulating material.

22. The device of claim 21, further comprising a second integrated circuit that physically attached at the lower surface of the encapsulating material and is electrically coupled the integrated circuit through the periphery leads.

23. The device of claim 16, wherein each of the central leads comprises a single conductive via that extends from the respective central bond pad to the outer surface of the encapsulating material.

24. The device of claim 16, wherein the central leads comprise an interposer disposed between the upper surface of the integrated circuit and the outer surface of the encapsulating material.

25. The device of claim 24, wherein the interposer comprises a semiconductor substrate and a plurality of conductive vias extending through the semiconductor substrate.

26. The device of claim 24, wherein the interposer is coupled to the central bond pads using electrically conductive paste or reflow solder.

27. The device of claim 24, further comprising a plurality of solder bodies disposed between the plurality of central bond pads and the interposer.

28. A quad-flat no-leads (QFN) packaged device comprising:
an integrated circuit having an upper surface that includes a peripheral region that surrounds a central region, a plurality of central bond pads being disposed in the central region and a plurality of periphery bond pads being disposed in the peripheral region;
a heat sink thermally coupled to a lower surface of the integrated circuit, the lower surface being opposite the upper surface;
an encapsulating material, wherein the integrated circuit is encapsulated within the encapsulating material, wherein the heat sink is exposed at a lower surface of the encapsulating material;
a plurality of periphery leads surrounding the integrated circuit and spaced therefrom by the encapsulating material, each periphery lead being L-shaped with a lower portion extending toward the integrated circuit, wherein an upper portion of each periphery lead is exposed at an upper surface of the encapsulating material and a lower portion of each periphery lead is exposed at the lower surface of the encapsulating material;
a plurality of bond wires electrically connecting each of the periphery bond pads to the lower portion a respective one of the periphery leads; and
a plurality of central leads, each central lead being electrically connected to a respective one of the central bond pads and extending to the upper surface of the encapsulating material, wherein the upper portions of the periphery leads and the central leads form a plurality of rows of external contacts.

29. The device of claim 28, wherein each of the periphery leads includes a sidewall exposed on a corresponding side of the encapsulating material.

30. The device of claim 28, wherein each of the central leads comprises a single conductive via that extends from the respective central bond pad to the upper surface of the encapsulating material.

31. The device of claim 28, wherein the central leads comprise an interposer disposed between the upper surface of the integrated circuit and the upper surface of the encapsulating material.

32. The device of claim 28 wherein, the lower portion of each periphery lead is spaced from the heat sink.

33. A quad-flat no-leads (QFN) packaged device comprising:
an integrated circuit comprising
a first major surface that includes an outer region that surrounds an interior region,
interior bond pads disposed in the interior region,
outer bond pads disposed in the outer region, and
a second major surface opposite to the first major surface;
an encapsulating material surrounding the integrated circuit and covering the first major surface, the encapsulating material comprising a third major surface facing away from the integrated circuit;
interior connectors disposed over the interior region of the first major surface, each interior connector being electrically connected to a respective one of the interior bond pads and extending to the third major surface of the encapsulating material; and
outer leads surrounding the integrated circuit, each outer lead being electrically connected to a respective one of the outer bond pads and extending to the third major surface of the encapsulating material, wherein upper portions of the outer leads and the interior connectors are part of an array of external contacts of the QFN package device.

34. The device of claim 33, wherein the interior connectors and the outer leads are disposed in the encapsulating material.

35. The device of claim 33, wherein the interior connectors comprise an interposer disposed between the first major surface of the integrated circuit and the third major surface of the encapsulating material.

36. The device of claim 35, further comprising a semiconductor substrate disposed over the first major surface of the integrated circuit, wherein the interposer is disposed in the semiconductor substrate and a plurality of conductive vias extend through the semiconductor substrate.

37. The device of claim 35, wherein the interposer is coupled to the interior bond pads using electrically conductive paste or reflow solder.

38. The device of claim 35, further comprising a plurality of solder bodies disposed between the interior bond pads and the interposer.

39. The device of claim 33, further comprising a heat sink thermally coupled to the second major surface of the integrated circuit.

* * * * *